United States Patent
Frenzel et al.

(10) Patent No.: US 11,209,490 B2
(45) Date of Patent: Dec. 28, 2021

(54) METHOD FOR OPERATING A BATTERY SENSOR, AND BATTERY SENSOR

(71) Applicant: Continental Automotive GmbH, Hannover (DE)

(72) Inventors: Henryk Frenzel, Regensburg (DE); Martin Schramme, Königsbrunn (DE)

(73) Assignee: CONTINENTAL AUTOMOTIVE GMBH, Hannover (DE)

(*) Notice: Subject to any disclaimer, the term of this patent is extended or adjusted under 35 U.S.C. 154(b) by 186 days.

(21) Appl. No.: 16/600,890

(22) Filed: Oct. 14, 2019

(65) Prior Publication Data

US 2020/0116795 A1 Apr. 16, 2020

(30) Foreign Application Priority Data

Oct. 15, 2018 (DE) .................... 10 2018 217 625.6

(51) Int. Cl.
*G01R 31/36* (2020.01)
*G01R 31/374* (2019.01)

(52) U.S. Cl.
CPC ....... *G01R 31/374* (2019.01); *G01R 31/3648* (2013.01)

(58) Field of Classification Search
CPC ...... G01R 31/364; G01R 1/20; G01R 31/006; G01R 31/66; G01R 31/389; G01R 31/392;
(Continued)

(56) References Cited

U.S. PATENT DOCUMENTS 6,300,763 B1 10/2001 Kwok
7,339,351 B2 3/2008 Murakami et al.
(Continued)

FOREIGN PATENT DOCUMENTS

CN 102998629 A 3/2013
CN 103383435 A 11/2013
(Continued)

OTHER PUBLICATIONS

German Search Report for German Application No. 10 2018 217 625.6, with partial translation, dated Aug. 28, 2019—13 pages.
(Continued)

*Primary Examiner* — Douglas X Rodriguez
*Assistant Examiner* — Trung Q Nguyen
(74) *Attorney, Agent, or Firm* — RatnerPrestia

(57) ABSTRACT

A method for operating a battery sensor and a battery sensor, having an acquisition device for capturing a battery parameter and outputting a battery value dependent on the battery parameter, an evaluation circuit determines a corrected battery value from the battery value and from a correction value, a correction value determination device captures an influencing value of an influencing parameter of the correction value. Storing in the correction value determination device a pre-determined relationship between the influencing parameter and a correction factor for at least two value ranges of the influencing parameter. The correction value determined by capturing an influencing value of the influencing parameter, determining the range of values of the influencing parameter, selecting a relationship corresponding to the range of values and of the correction factor, determining and outputting the correction factor corresponding to the influencing parameter value range, and determining the correction value with the correction factor.

18 Claims, 2 Drawing Sheets

(58) Field of Classification Search
CPC ...... G01R 31/382; H01M 10/48; H01M 2/30; H02J 7/0019; H02J 7/0016; Y02E 60/10
USPC ............ 324/415, 437, 425–433, 76.11, 126, 324/756.05, 538, 200, 207.13, 233, 256, 324/500–530, 750.06
See application file for complete search history.

(56) References Cited

U.S. PATENT DOCUMENTS

| | | |
|---|---|---|
| 8,311,760 B2 | 11/2012 | Hohe et al. |
| 10,132,907 B2 | 11/2018 | Schramme et al. |
| 2006/0117194 A1 | 6/2006 | Nishida |
| 2008/0228421 A1 | 9/2008 | Guichard et al. |
| 2013/0154653 A1 | 6/2013 | Boehm et al. |
| 2015/0260552 A1 | 9/2015 | Yao et al. |
| 2018/0149705 A1 | 5/2018 | Hagimori et al. |
| 2020/0011905 A1 | 1/2020 | Schramme et al. |

FOREIGN PATENT DOCUMENTS

| | | |
|---|---|---|
| CN | 105203968 A | 12/2015 |
| CN | 105548912 A | 5/2016 |
| CN | 105794323 A | 9/2016 |
| CN | 106249186 A | 12/2016 |
| CN | 108287310 A | 7/2018 |
| DE | 102004062655 A1 | 7/2006 |
| DE | 102007044471 A1 | 4/2009 |
| DE | 102010001529 A1 | 8/2011 |
| DE | 102015217862 A1 | 3/2016 |
| DE | 102016204941 A1 | 9/2017 |
| DE | 102017203535 A1 | 9/2018 |
| DE | 102017223535 A1 | 6/2019 |
| JP | 2001110459 A | 4/2001 |
| JP | 2003197272 A | 7/2003 |
| WO | 2012098968 A1 | 7/2012 |
| WO | 2017140874 A1 | 8/2017 |
| WO | 2018162021 A1 | 9/2018 |
| WO | 2019081365 A1 | 5/2019 |

OTHER PUBLICATIONS

European Search Report for European Application No. EP19202621.9, dated Feb. 28, 2020 with partial translation, 16 pages.
Chinese Office Action for Chinese Application No. 201910975513.7, dated Sep. 1, 2021 with translation, 15 pages.

METHOD FOR OPERATING A BATTERY SENSOR, AND BATTERY SENSOR

CROSS REFERENCE TO RELATED APPLICATIONS

This application claims priority to German Patent Application No. 10 2018 217 625.6, filed Oct. 15, 2018, the contents of such application being incorporated by reference herein.

BACKGROUND OF THE INVENTION

Battery sensors are used in vehicles to capture battery parameters of the vehicle battery in order to be able to make statements on the battery status, such as the state of charge of the battery. The battery parameters to be captured are, for example, the battery voltage, the battery current and the battery temperature, wherein in particular the battery voltage and the battery current must be permanently captured, for example, to be able to make a precise statement about the state of charge of the battery.

In order to be able to make accurate statements about the battery condition, a high degree of accuracy of the capture devices for the battery parameters is required. The accuracy of the capture devices, however, depends on many factors. For example, the current ambient temperature or the current battery temperature can have an impact on the measurement accuracy, since an electrical resistance of a measuring resistor of a capture device can be dependent on temperature. Furthermore, over the life span of the battery sensor aging effects can occur, which can also affect the measurement accuracy. In addition, individual events, such as high load peaks or mechanical stresses can affect the measurement accuracy.

In order to keep the measurement accuracy as high as possible, it is attempted to select the components or their materials so that the possible total deviation of the battery sensor resulting from the possible deviations of the individual components remains within the required tolerances.

It is also generally known that changes in the properties of the components, such as an age-related change in the electrical resistance, is greatest at the beginning of the service life span, hence in the new condition. With increasing service life, the properties of the components converge to a final value. For this reason, components are often subjected to a pre-aging process before installation, that is to say, before installation the components are stressed so that a large part of the aging takes place even before the installation of the component. But this is very time-consuming and costly. In addition, the rate of aging also depends on the usage and/or the loading in the vehicle. High currents or extreme temperatures, for example, lead to faster aging. Even with a pre-aging therefore it is difficult to estimate how the aging of the components of the battery sensor will progress in the operation of the vehicle.

SUMMARY OF THE INVENTION

An aspect of the invention is a method for operating a battery sensor and a battery sensor, which allow a better estimation of age-related changes.

An aspect of the invention is a method for operating a battery sensor, having at least one acquisition device for capturing at least one battery parameter and for outputting a battery value dependent on the battery parameter, with an evaluation circuit for determining a corrected battery value from the battery value and from a correction value, and having a correction value determination device for capturing at least one influencing value of an influencing parameter of the correction value, wherein in the correction value determination device a pre-determined relationship between the influencing parameter and a correction factor is stored for at least two value ranges of the influencing parameter. The method comprises the following steps:

- capturing at least one influencing value of the at least one influencing parameter,
- determining the range of values of the influencing parameter,
- selection of the influencing factor corresponding to the value range,
- determination and output of the correction factor corresponding to the value range of the influencing parameter, and
- determination of the correction value with the correction factor.

An aspect of the invention is based on the proposal to install the components of the battery sensor without artificial aging. It is necessary, however, to estimate the aging of the components of the battery sensor as accurately as possible, so as to determine a correction factor dependent on the respective influencing factor, from which a correction value for the measured battery value can be determined.

To this end the dependence of the components of the battery sensor on the at least one influencing parameter is determined in advance, and from this a correction factor or a correction value for the measured battery value is derived. This relationship between the influencing parameter and the correction factor or correction value is determined for various influencing values of the influencing parameter and is stored in a correction value determination device. In the operation of the battery sensor, in addition to the battery parameter the influencing parameter is determined and in each case the correction factor corresponding to the measured influencing value of the influencing parameter is selected.

Then, using this correction factor a correction value is determined by which the measured battery value is corrected.

This method is repeated in the operation of the battery sensor in order to adjust the correction factors and the correction value to the particular influencing parameters having an impact on the components of the battery sensor, in particular on the capture device. This is necessary, in particular, because a change in the influencing value of an influencing parameter has an effect on the aging of the components of the battery sensor. For example, a high temperature leads to faster aging.

For example, the method can be repeated periodically, to obtain a regular adaptation of the correction factors and the correction value. The method can additionally be performed, however, when an influencing value exceeds a limit value or an exceptionally high influencing value is acquired. The limit value can be, for example, a single value or a time period over which the individual value is present.

In particular, the time over which the influencing value is present can also be recorded, and this time can be taken into account in the determination of the correction factor or correction value.

Thus no direct measurement of the deviation of the measurement accuracy of the capture device takes place, but instead the influencing parameters that have an impact on the accuracy of the capture device are acquired. From the recording of the influencing parameters and the previously determined behavior of the capture devices in the presence of the influencing parameter, the deviation of the measurement accuracy is estimated.

Because a prior aging of the components of the battery sensor is no longer necessary, the production costs for the battery sensor can be significantly reduced. In addition, even if a prior aging of the components is performed, in the operation of the battery sensor an aging drift occurs which can be determined with the method described above. Overall therefore, the measurement accuracy of the battery sensor can be greatly improved, because age-related changes in the measurement accuracy can be determined very accurately.

The pre-determined relationship between the influencing parameter and the correction value can comprise a first influencing factor that is independent of time, in particular a linear relationship between the influencing parameter and the correction value. With this first influencing factor, an aging drift is assumed to be solely dependent on the influencing parameter, for example. In other words, it is assumed that for an influencing value of an influencing parameter, a uniform change in the measurement accuracy takes place over the operating time of the battery sensor, thus over the life span of the battery sensor.

The pre-determined relationship between the influencing parameter and the correction value can also comprise a second influencing factor, which is dependent on the total operating time of the battery sensor, wherein additionally the total operating time of the battery sensor is acquired and the second influencing factor is determined as a function of the total operating time and the value range of the influencing parameter. The aging drift of a property of the capture devices can tend towards a limit value. This means that initially the capture devices exhibit a high change in the measurement properties, which reduces with increasing operating time of the battery sensor. In order to take account of this property, a time-dependent second influencing factor and its temporal profile are determined and stored. In the operation of the battery sensor, in addition to the influencing parameter the operating time of the battery sensor is also recorded, so that the influencing factor is determined not only as a function of the determined influencing value of the influencing parameter, but also as a function of the operating time of the battery sensor. The recorded time of the battery sensor can be additionally fed into the determination of the correction value from the correction factor.

For example, both a first influencing factor and a second influencing factor are determined and a first, time-independent influencing factor is corrected with the second influencing factor as a function of the determined total operating time.

The pre-determined relationship between the influencing parameter and the correction value can comprise, for example, at least two characteristic curves, in particular a characteristic map. Thus, for each of the various influencing values of the influencing parameter a characteristic curve is stored.

An aging of the battery sensor can be caused by various influences acting on the battery sensor. For example, aging is also caused by the normal operation of the battery sensor, i.e. by the battery parameters that are captured by the capture device. At least one influencing parameter can therefore be a battery parameter, in particular a battery current, a battery voltage and/or a battery temperature.

In addition, other influences have an impact on the battery sensor, which cause a change in the measurement range or the measurement accuracy of the battery sensor. At least one influencing parameter can therefore be independent of the battery, in particular a mechanical stress. Such external influencing parameters can be, for example, weather factors such as outside temperature, salt mist, corrosion or mechanical stresses such as vibrations.

If the influencing parameter is a battery parameter, the influencing parameter can be captured with a capture device for sensing a battery parameter, so that no additional capture devices, in particular no additional sensors, are required.

If the influencing parameter is an external influence on the battery sensor, the influencing parameter is captured with an influencing parameter acquisition device for capturing at least one influencing parameter and for outputting at least one influencing value to the correction value determination device. An additional sensor is therefore provided, which acquires the influencing parameter and outputs an influencing value.

In order to improve the accuracy of the method, a plurality of influencing parameters can also be acquired, wherein in the correction value determination device at least one pre-determined relationship between the influencing parameter and the correction factor is stored for a plurality of influencing parameters, with one correction factor being determined for each influencing parameter.

The correction value can be corrected, for example, with the individual correction factors. However, it is also possible to determine an overall correction factor from the determined correction factors, which is used to determine the correction value.

In the correction value determination device an initial correction value can be stored, which is corrected with the determined correction factor. The new correction value determined from the initial correction value and the correction factor can be stored as a new initial correction value and can be corrected again with the determined correction factor upon a repetition of the method. Thus a permanent adjustment of the correction value takes place.

Optionally, the method can have further steps, for example for self-monitoring or for calibrating the battery sensor. For example, a battery parameter with a known size can be applied to the battery sensor and it can be checked whether the battery value corrected with the correction value agrees with the applied value of the battery parameter.

For example, the battery sensor can comprise a current capture device, which has a measuring resistor and a voltage capture device for sensing a voltage drop across the measuring resistor. The current flowing through the measuring resistor is determined from the voltage drop sensed across the measuring resistor and the known electrical resistance of the measuring resistor. The electrical resistance of the measuring resistor can change depending on influencing factors, however, and this change is corrected with the determination of the correction value using the method described above.

In addition, a reference current with a known size can be applied to the measuring resistor and the voltage drop of this reference current across the measuring resistor can be captured with the voltage capture device. From the voltage drop and the known reference current, the electrical resistance of the measuring resistor can be determined using Ohm's law. Given a subsequent load current measurement, the load current determined with the calculated electrical resistance can be compared with the load current determined with the correction value, and thus the correction value can be adjusted as necessary.

To achieve the object a battery sensor is also provided, in particular for capturing a battery parameter, having at least one capture device for capturing at least one battery parameter and for outputting a battery value dependent on the battery parameter. The battery sensor additionally comprises an evaluation circuit for determining a corrected battery value from the battery value and a correction value, and a correction value determination device for capturing at least one influencing value of an influencing parameter of the correction value, wherein in the correction value determination device a pre-determined relationship between the influencing parameter and the correction value is stored for at least two value ranges of the influencing parameter. The battery sensor is designed to determine the correction value with a method described above. In particular, the battery sensor is designed to carry out the following steps:

- capturing at least one influencing value of the at least one influencing parameter,
- determining the range of values of the influencing parameter,
- selection of the at least one influencing factor corresponding to the value and/or to the range of values, and
- determination and output of the correction factor corresponding to the value range of the influencing parameter, and
- determination of the correction value with the correction factor.

BRIEF DESCRIPTION OF THE DRAWINGS

Further advantages and features arise from the following description in connection with the appended drawings, which show.

DETAILED DESCRIPTION OF THE PREFERRED EMBODIMENTS

Figure 1:
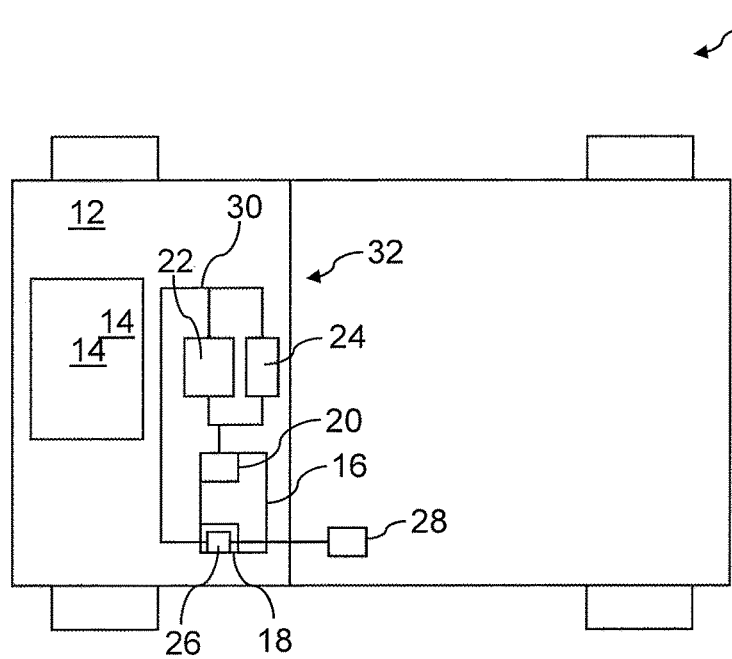
FIG. 1 a schematic illustration of a vehicle with an electrical circuit.

FIG. 1 shows a vehicle 10. The vehicle 10 has an engine compartment 12 in which a drive unit 14 is provided. In addition, a vehicle battery 16 with two battery terminals 18, 20 is provided, which is electrically connected to a plurality of electrical consumers 22, 24. The electrical consumers, 22, 24 can be any electrical or electronic components of the vehicle 10, such as an air conditioning system, driving assistance systems or even parts of the drive unit 14. In particular, the drive unit 14 can also be an electrical consumer, which is electrically connected to the vehicle battery 16.

On the vehicle battery 16, in particular on the battery terminal 18, a battery sensor 26 is also provided. The battery sensor 26 captures at least one, preferably a plurality of, battery values to be able to make statements about the battery condition, in particular about the state of charge of the vehicle battery 16. The battery sensor 26 can be connected to a control unit 28 of the vehicle, which evaluates the signals from the battery sensor 26.

The battery sensor 26, the consumers 22, 24 and the vehicle battery 16 are connected to one another via electrical connections 30 and together with these electrical connections 30 form an electrical circuit 32. The electrical connections 30 can be formed, for example, by cables or parts of the vehicle bodywork.

Figure 2:
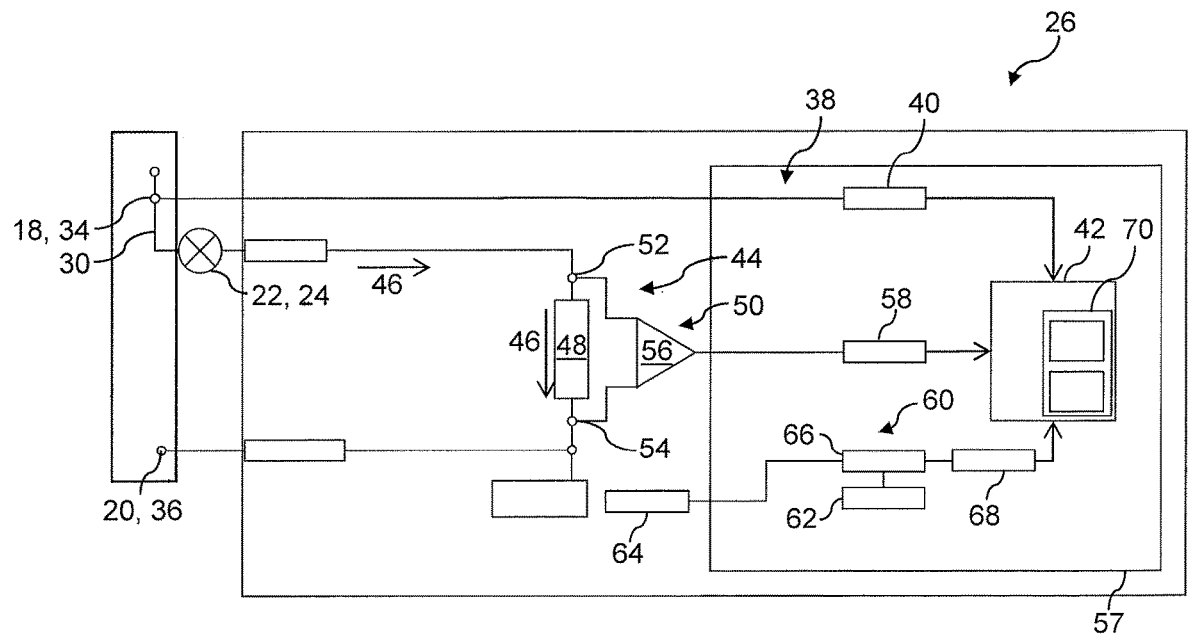
FIG. 2 a schematic illustration of a battery sensor.

FIG. 2 shows one embodiment of a battery sensor 26. On a first connector 34 of the battery sensor 26 an electrical connection 30 is provided, which like the consumers 22, 24 is connected to a terminal 18 of the vehicle battery 16. The second connector 36 is formed by a terminal post, via which the battery sensor 26 is electrically connected to the second battery terminal 20.

The battery sensor 26 shown here is designed to capture the battery voltage, the battery current and the battery temperature as battery parameters.

To measure the battery voltage a voltage capture device 38 is provided, which is connected to the first connector 30 or the first battery terminal 18. The voltage capture device 38 is connected via an analog-to-digital converter to an evaluation circuit 42 of the battery sensor 26.

In addition, a current capture device 44 for capturing the load current 46 is provided between the first battery terminal 18 and the second battery terminal 20. The current capture device has a measuring resistor 48 with a known electrical resistance arranged in the path of the load current 46. The measuring resistor 48 is preferably made from a material that has a low temperature coefficient and a low aging drift of the electrical resistance, for example from a copper-nickel-manganese alloy.

In addition, the current capture device 44 has a voltage capture device 50 which is contacted with contacts 52, 54 before and after the measuring resistor 48, so that the former can capture a voltage drop of the load current 46 across the measuring resistor 48. The current capture device 44 also has an amplifier 56 and an analog-to-digital converter 58, which is connected to the evaluation circuit 42.

From the voltage drop across the measuring resistor 48 detected with the voltage measuring device 50 and the known electrical resistance of the measuring resistor 48, the current flowing through the measuring resistor 48, in other words the load current 46, can be determined using Ohm's law. The value of the load current 46 determined with the current measuring device 44 is output to the evaluation circuit 42.

The battery temperature is captured with a temperature sensing device 60, a first temperature sensor 62 and/or a second temperature sensor 64. The first temperature sensor 62 is arranged on a printed circuit board 57, on which the evaluation circuit 42 and the analog-to-digital converters 40 and 58 are also provided. The second temperature sensor 64 can be provided on the measuring resistor 48 or the vehicle battery 16, for example. By means of a changeover switch 66 either the first temperature sensor 62 or the second temperature sensor 64 can be connected to an analog-to-digital converter 68, which is connected to the evaluation circuit 42.

The measurement inaccuracies and/or the measurement ranges of the capture devices 38, 44, 60 can change and/or shift over the life span and/or as a result of factors acting on the capture devices 38, 44, 60. For this reason, the captured battery values of the battery parameters, i.e. battery voltage, the battery current and/or the battery temperature, are corrected with a correction value in the evaluation circuit 42.

For the determination of the correction value for a battery parameter, a correction value determination device 70 is provided in the evaluation circuit 42. The correction value determination device has at least one input for an influencing value of an influencing parameter that affects the correction value. In the following exemplary embodiment described in FIG. 3, three influencing parameters are provided, wherein the first influencing parameter 72 is the battery current determined with the current capture device and a second influencing parameter 74 is the battery temperature captured with the temperature sensing devices 60. A third influencing parameter 76 can be, for example, a mechanical stress acting on the battery sensor 26.

Figure 3:
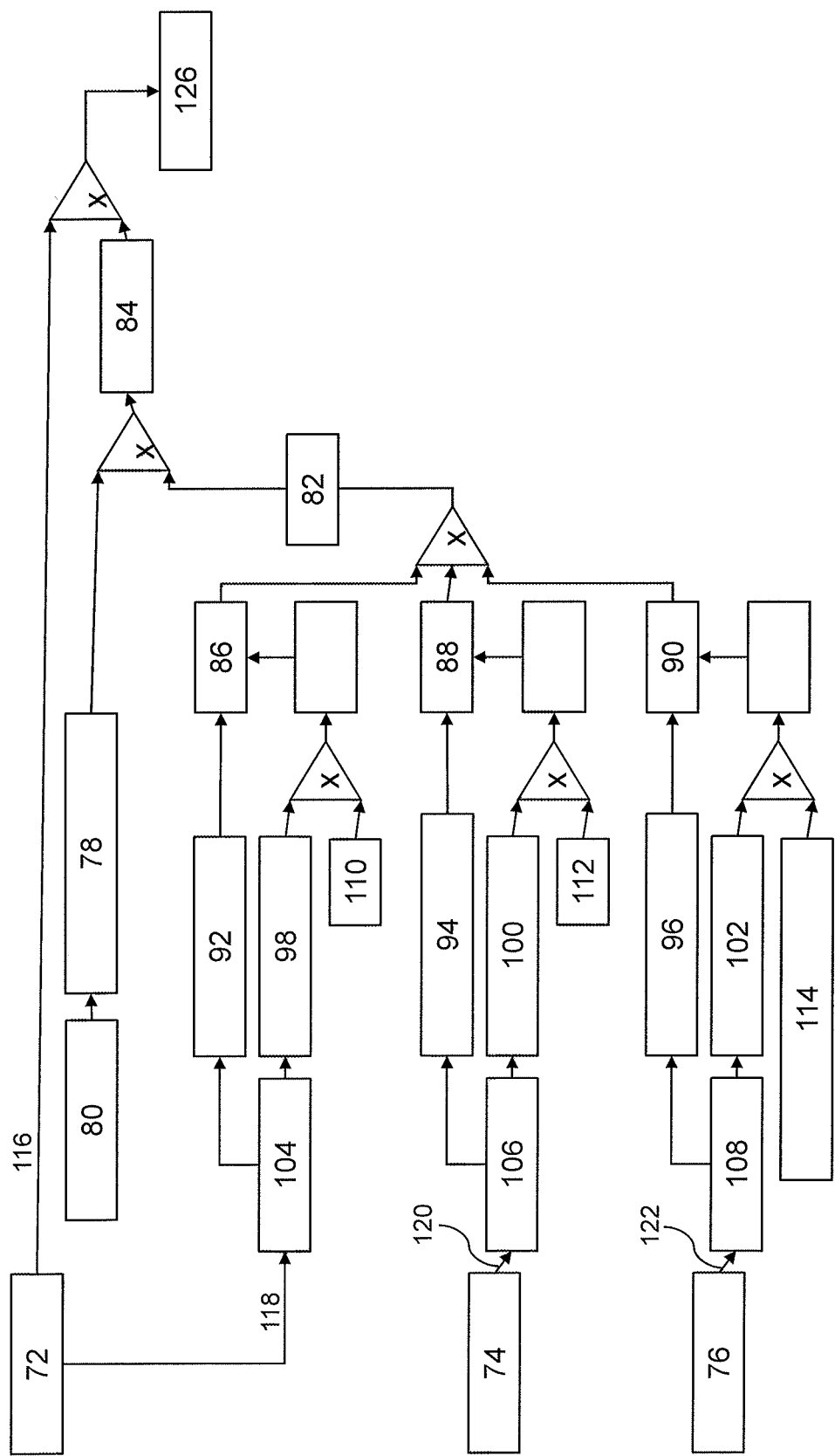
FIG. 3 a flow chart of a method for determining a correction value with the battery sensor of FIG. 2.

As can be seen in FIG. 3, in the correction value determination device 70 an initial correction value 78 is stored, which has been determined using a calibration procedure 80. In the method described below, the determination of a correction factor 82 is described, with which, from the initial correction value 78, the correction value 84 is determined by which the battery parameter is corrected.

For each of the influencing parameters 72, 74, 76, a relationship between the influencing parameter and the correction value has been determined in advance for at least two value ranges of the influencing parameter, for example, by means of experiments. From this relationship, for the different value ranges of the influencing parameter 72, 74, 76 in each case a relationship is determined between the influencing parameter and a correction factor 86, 88, 90, which is stored in the correction value determination device 70.

In the embodiment of the method described in FIG. 3, for each influencing parameter 72, 74, 76 a time-independent first influencing factor 92, 94, 96 is stored.

In addition, a second, time-dependent influencing factor 98, 100, 102 is stored. The aging of the capture devices is usually very high at the beginning of the operating lifetime and with the operating lifetime of the battery sensor 26 approaches a limit value (92, 94, 96). This circumstance is taken into account with the second, time-dependent influencing factor 98, 100, 102.

For example, the relationship between the influencing parameters 72, 74, 76 and the correction factors 86, 88, 90 can also be stored in the form of a characteristic map 104, 106, 108, wherein for each different value range of the battery parameter 72, 74, 76 one characteristic has been determined in advance and stored.

In addition, for the second influencing factor 98, 100, 102, using a measuring device 110, 112 the operating time, or using a measuring device 114 the time for which the influencing parameter is applied and/or the number of events of the battery parameter 76 is/are measured.

To determine the battery value 126 the battery parameter, thus in the embodiment shown here the battery current, is first captured and a battery value 116 is output to the evaluation circuit 42.

Furthermore, the influencing parameters are captured and the influencing values 118, 120, 122 are output to the correction value determination device 70. In the correction value determination device 70, for the captured influencing values 118, 120, 122 the value ranges and hence the correction factors 86, 88, 90 corresponding to the value ranges are determined and output. Then, from the correction factors 86, 88, 90, an overall correction factor 82 is determined with which the initial offset value 78 is corrected.

Then, the measured battery value 116 is corrected with this corrected correction value 84 and is output as a corrected battery value 126.

This procedure is repeated, for example, at regular intervals or upon detection of certain events that have an effect on the aging of the battery sensor 26. In this case, the determined or corrected correction value 84 is stored as a new initial correction value 78 and corrected with the next determined overall correction factor 82.

As can be seen in FIG. 3, the correction factors 86, 88, 90 are determined in each case from the characteristic map 104, 106, 108, the first influencing factor 92, 94, 96 and the second influencing factor 98, 100, 102. The second influencing factor 96, 100, 102 is corrected, taking account of the operating time identified with the measuring device 110, 112, 114, or the duration or the number of events, and then increased if necessary. Then, each first influencing factor 92, 94, 96 is corrected with the second influencing factor 98, 100, 102.

With the method described above therefore, no direct measurement or capture of a change or shift in a measuring range or a measurement accuracy of the battery sensor 26 takes place. Instead, the influencing parameters 72, 74, 76 that have an influence on a change or shift of a measuring range or a measurement accuracy of the battery sensor 26 are determined and the change in the shift of the measuring range or the measurement accuracy is determined on the basis of the influencing parameters 72, 74, 76 acting on the battery sensor 26. For this purpose, in particular for each influencing parameter 72, 74, 76, value ranges are defined, wherein for each value range a relationship between the influencing parameter and the correction factor has been determined in advance. Since the aging behavior is determined as a function of the active influencing parameters 72, 74, 76, no pre-aging of the components of the battery sensor 26 is therefore required.

In order to check the accuracy of the determination of the correction factor 82 or the correction value 84, the battery sensor can have additional calibration methods or test methods.

For example, a reference current circuit can be provided with which a reference current with known size can be applied to the measuring resistor 48. The battery current captured with the current capture device and corrected with the determined correction value can be compared with the reference current. In the event of a deviation of the corrected battery current from the reference current, for example, the initial offset value 78 can be adjusted.

In addition, additional test or calibration procedures can be provided, which enable testing or adjustment of the correction factor 118 and/or the correction value 84.

LIST OF REFERENCE NUMERALS 10 vehicle
12 engine compartment
14 drive unit
16 vehicle battery
18 first battery terminal
20 second battery terminal
22 consumer
24 consumer
26 battery sensor
28 controller
30 electrical connection
32 electrical circuit
34 first connection
36 second connection
38 voltage capture device
40 analog-to-digital converter
42 evaluation circuit
44 current capture device
46 load current
48 measuring resistor
50 voltage measuring device
52 contact point
54 contact point
56 amplifier
58 analog-to-digital converter
60 temperature sensing device
57 circuit board
62 first temperature sensor
64 second temperature sensor 66 changeover switch
68 analog-to-digital converter
70 correction value determination device
72 first influencing parameter
74 second influencing parameter
76 third influencing parameter
78 initial correction value
80 calibration procedure
82 correction factor
84 correction value
86 correction factor of the first influencing parameter
88 correction factor of the second influencing parameter
90 correction factor of the third influencing parameter
92 first influencing factor of the first correction factor
94 first influencing factor of the second correction factor
96 first influencing factor of the third correction factor
98 second influencing factor of the first correction factor
100 second influencing factor of the second correction factor
102 second influencing factor of the third correction factor
104 characteristic map of the first influencing parameter
106 characteristic map of the second influencing parameter
108 characteristic map of the third influencing parameter
110 measuring device
112 measuring device
114 measuring device
116 battery values
118 influencing values of the first influencing parameter
120 influencing values of the first influencing parameter
122 influencing values of the first influencing parameter
126 corrected battery value

The invention claimed is:

1. A method for operating a battery sensor, having at least one capture device for capturing at least one battery parameter and outputting a battery value dependent on the battery parameter, having an evaluation circuit for determining a corrected battery value from the battery value and from a correction value, and having a correction value determination device for capturing at least one influencing value of an influencing parameter of the correction value, wherein in the correction value determination device a pre-determined relationship between the influencing parameter and a correction factor is stored for at least two value ranges of the influencing parameter, the at least one capture device includes at least one of a current capture device coupled between a first battery terminal and a second battery terminal to capture a battery current, a voltage capture device coupled to the first battery terminal to capture battery voltage, and a temperature capture device capturing battery temperature or ambient temperature, the correction value being determined by:
    a) capturing, by the at least one capture device, at least one influencing value of the at least one influencing parameter, the at least one influencing value including at least one of the battery current, the battery voltage, the battery temperature, or the ambient temperature,
    b) determining, by the evaluation circuit, a range of values of the captured at least one influencing parameter,
    c) adjusting, by the evaluation circuit, the range of values of the captured at least one influencing parameter based on at least one time-dependent influencing factor that influences operation of the at least one capturing device,
    d) selecting, by the evaluation circuit, the pre-determined relationship corresponding to the adjusted range of values of the captured at least one influencing parameter and of the correction factor,
    e) determining and outputting, by the evaluation circuit, the correction factor based on the adjusted range of values of the captured at least one influencing parameter, and
    f) determining, by the evaluation circuit, the correction value with the correction factor.

2. The method as claimed in claim 1, wherein the steps a) to f) are carried out repeatedly.

3. The method as claimed in claim 1, wherein the pre-determined relationship between the influencing parameter and the correction factor comprises a first influencing factor, which is time-independent.

4. The method as claimed in claim 1, wherein the pre-determined relationship between the influencing parameter and the correction factor comprises a second influencing factor which is dependent on a time, wherein additionally the time is detected and the second influencing factor is determined as a function of time, and the value range of the influencing parameter.

5. The method as claimed in claim 4, wherein a first, time-independent influencing factor is corrected with the second influencing factor, depending on the determined time.

6. The method as claimed in claim 1, wherein the pre-determined relationship between the influencing parameters and the correction value comprises at least two characteristics.

7. The method as claimed in claim 1, wherein at least one influencing parameter is a battery parameter.

8. The method as claimed in claim 1, wherein at least one influencing parameter is independent of the battery.

9. The method as claimed in claim 1, wherein the influencing parameter is acquired with an acquisition device for sensing a battery parameter.

10. The method as claimed in claim 1, wherein the influencing parameter is captured with an influencing parameter acquisition device for capturing at least one influencing parameter and for outputting at least one influencing value to the correction value determination device.

11. The method as claimed in claim 1, wherein in the correction value determination device for a plurality of influencing parameters at least one pre-determined relationship between the influencing parameter and the correction factor is stored, one correction factor being determined for each influencing parameter.

12. The method as claimed in claim 11, wherein from the determined correction factors an overall correction factor is determined, with which the correction value is determined.

13. The method as claimed in claim 1, wherein in the correction value determination device an initial correction value is stored, which is corrected with the determined correction factor.

14. The method as claimed in claim 1, wherein the pre-determined relationship between the influencing parameter and the correction factor comprises a first influencing factor, which is a linear relationship between the influencing parameter and the correction value.

15. The method as claimed in claim 1, wherein the pre-determined relationship between the influencing parameter and the correction factor comprises a second influencing factor which is dependent on the total operating time of the battery sensor, wherein the total operating time of the battery sensor is detected and the second influencing factor is determined as a function of the total operating time, and the value range of the influencing parameter.

16. The method as claimed in claim 1, wherein at least one influencing parameter is at least one of a battery current, a battery voltage or a battery temperature.

17. The method as claimed in claim 1, wherein at least one influencing parameter is a mechanical stress.

18. A battery sensor, comprising:
- at least one capture device for capturing at least one battery parameter and outputting a battery value dependent on the battery parameter;
- an evaluation circuit for determining a corrected battery value from the battery value and from a correction value; and
- a correction value determination device for capturing at least one influencing value of an influencing parameter of the correction value, wherein in the correction value determination device a pre-determined relationship between the influencing parameter and a correction factor is stored for at least two value ranges of the influencing parameter, the at least one capture device includes at least one of a current capture device coupled between a first battery terminal and a second battery terminal to capture a battery current, a voltage capture device coupled to the first battery terminal to capture battery voltage, and a temperature capture device capturing battery temperature or ambient temperature, wherein the battery sensor determines the correction value by:
a) capturing at least one influencing value of the at least one influencing parameter, the at least one influencing value including at least one of the battery current, the battery voltage, the battery temperature, or the ambient temperature,
b) determining a range of values of the captured at least one influencing parameter,
c) adjusting the range of values of the captured at least one influencing parameter based on at least one time-dependent influencing factor that influences operation of the at least one capturing device,
d) selecting the predetermined relationship corresponding to the adjusted range of values of the captured at least one influencing parameter and of the correction factor,
e) determining and outputting the correction factor based on the adjusted range of values of the captured at least one influencing parameter, and
f) determining the correction value with the correction factor.

* * * * *